United States Patent [19]

Hsu et al.

[11] Patent Number: 4,999,691
[45] Date of Patent: Mar. 12, 1991

[54] INTEGRATED CIRCUIT WITH STACKED MOS FIELD EFECT TRANSISTORS

[75] Inventors: Sheng T. Hsu, West Windsor Township, Mercer County; Doris W. Flatley, Hillsborough Township, Somerset County, both of N.J.

[73] Assignee: General Electric Company, Schenectady, N.Y.

[21] Appl. No.: 453,090

[22] Filed: Dec. 22, 1989

Related U.S. Application Data

[63] Continuation of Ser. No. 137,544, Dec. 23, 1987, abandoned, which is a continuation of Ser. No. 769,146, Aug. 26, 1985, abandoned.

[51] Int. Cl.$^5$ .................... H01L 27/092; H01L 29/04
[52] U.S. Cl. ...................... 357/23.7; 357/42; 357/59
[58] Field of Search ............ 357/23.7, 4, 59, 42

[56] References Cited

U.S. PATENT DOCUMENTS

| | | | |
|---|---|---|---|
| 4,272,880 | 6/1981 | Pashley | 357/23.7 |
| 4,476,475 | 10/1984 | Naem et al. | 357/23.7 |
| 4,502,202 | 3/1985 | Malhi | 357/59 E |
| 4,555,843 | 12/1985 | Malhi | 357/23.7 |
| 4,603,468 | 8/1986 | Lam | 357/23.7 |
| 4,628,589 | 12/1986 | Sundaresan | 357/23.7 |

OTHER PUBLICATIONS

Colinge et al, IEEE Trans. of Electron Devices, vol. ED29, No. 4, Apr. 1982, pp. 585-589.
Gibbons, IEEE Electron Device Letters, vol. EDL-1, No. 6, Jun. 1980, pp. 117-118.
Shah et al, Digest of Technical Papers, Symposium of VLSI Technology, pp. 8-9.

Primary Examiner—William D. Larkins
Attorney, Agent, or Firm—Paul R. Webb, II; James C. Davis, Jr.

[57] ABSTRACT

A structure and method for making a pair of MOS field effect transistors (MOSFETs), one stacked upon the other in an integrated circuit device is disclosed. In one embodiment of the device, the active layer of the upper MOSFET is epitaxially grown from an exposed surface of the active layer of the lower MOSFET. In another embodiment, the active layer of the upper MOSFET is polysilicon which, optionally, may be recrystallized. In all embodiments, the pair of MOSFETs share a common gate.

6 Claims, 3 Drawing Sheets

INTEGRATED CIRCUIT WITH STACKED MOS FIELD EFECT TRANSISTORS

This application is a continuation of application Ser. No. 07/137,544, filed Dec. 23, 1987, which is a continuation of application Ser. No. 06/769,146, filed Aug. 26, 1985, both now abandoned.

This invention relates to MOS field effect transistors (MOSFETs) for an integrated circuit device wherein one such transistor is formed vertically above another transistor, each of which share a common gate.

BACKGROUND OF THE INVENTION

In recent years, various three dimensional integrated circuit devices have been proposed to meet the increasing need for higher density integrated circuits. Attempts to fabricate MOSFET devices stacked on the top of bulk silicon MOSFETs include the recrystallization of a polycrystalline silicon layer formed over the bulk silicon MOSFET. Typically, the recrystallization procedure would include a heat treatment for a period of one hour or more at a temperature exceeding about 950° C. Such a procedure may cause excessive diffusion of the N+ and P+ regions of the bulk MOSFETs compromising the potential performance of VLSI circuit devices fabricated in this way. Additionally, prior art stacked MOSFET structures contain substantial unwanted parasitic capacitance due to gate overlap with the source and drain regions.

What is needed is a structure and method of making that avoid the need for a high temperature, long duration heat treatment and result in reduced parasitic capacitance due to source/drain and gate overlap.

SUMMARY OF THE INVENTION

According to the present invention there is shown a pair of MOSFETs having a common gate and arranged in an integrated circuit device and a method of making the MOSFETs. Highly doped first and second regions of either conductivity type are disposed in the semiconducting body of the device and extend inwardly from a planar surface of the body. The first and second regions are spaced to define a first channel therebetween. A layer of silicon oxide is disposed on the planar surface over the first and second regions and the first channel. A layer of silicon is disposed on the layer of silicon oxide and extends over the first and second regions and the first channel. Highly doped third and fourth regions of either conductivity type are disposed in the layer of silicon and extend to the layer of silicon oxide. The third and fourth regions are spaced to define a second channel therebetween, the second channel being substantially opposite the first channel. A gate is disposed between the body and the layer of silicon in substantial alignment with the first and second channels. The gate is insulated from the body and from the layer of silicon and has a length that is substantially the same as that of the first channel.

DESCRIPTION OF THE PREFERRED EMBODIMENT

In the following description and as shown in FIGS. 1 through 10, specific P and N conductivity type materials and regions are indicated. These indications are by way of example and shall not be deemed to limit the teachings of the present invention. It will be understood that devices having opposite P and N arrangements are considered equivalent in all pertinent respects to the devices described herein.

Figure 1:
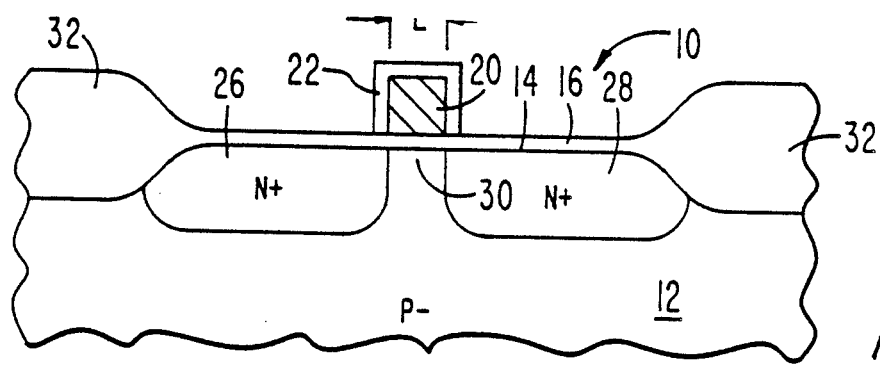
FIGS. 1 through 4 are schematic representations of cross-sectional views of a portion of an integrated circuit device showing the structure and various steps of manufacture of a pair of MOSFETs utilizing the teachings of the present invention.

There is shown in FIGS. 1 through 4 a portion of an integrated circuit device 10 including a semiconducting body 12 of a first conductivity type material, which is lightly doped P type in the present example, having a planar surface 14. A relatively thin layer 16 of insulating material, such as silicon oxide, is disposed on the planar surface 14 as shown in FIG. 1. A gate 20, which may be of any suitable metal, metal silicide, or doped silicon, is disposed on the insulating layer 16 and has a length indicated by "L" in FIG. 1. Another layer 22 of insulating material, such as silicon oxide, is arranged to cover all exposed surfaces of the gate 20. Highly doped first and second regions 26 and 28 disposed in the body 12 are the source and drain regions respectively of a lower MOSFET. A first channel 30, seen in FIG. 1, is defined by the first and second regions. The first and second regions, while they may be of either conductivity type are, in the present example, highly doped second conductivity type, or N+ type. The first and second regions are formed by any suitable self-aligning technique that is well known in the art that will result in the length $L_1$ of the channel 30 being substantially the same as the length L of the gate 20. Isolation oxide 32 is formed in the usual manner and is arranged to electrically isolate the various components of the integrated circuit.

The specific materials and processing techniques utilized to obtain the device 10, as depicted in FIG. 1, are well known in the art and any suitable one of the several well known procedures in use today may be advantageously employed. The device 10, as depicted in FIG. 1, represents the starting structure to which the unique features of the present invention are combined.

Figure 2:
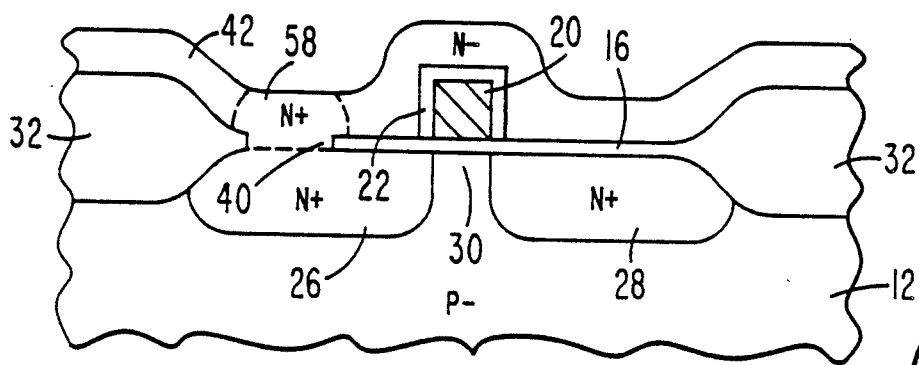

As shown in FIG. 2, an opening 40 is formed in the oxide layer 16 over a portion of the first region 26 thereby exposing the surface 14. An epitaxial layer 42 of single crystal silicon is then grown from the exposed silicon. Such epitaxial layers can be fabricated utilizing the epitaxial lateral overgrowth (ELO) fabrication technique disclosed, for example, in copending U.S. patent application Ser. No. 553,305, METHOD FOR GROWING MONOCRYSTALLINE SILICON ON A MASK LAYER, J. F. Corboy et al., filed Nov. 18, 1983, and which issued on Oct. 29, 1985, as U.S. Pat. No. 4,549,926. Basically, the ELO process involves a repetitious, two phase, deposition/etch cycle whereby monocrystalline silicon is grown from a monocrystalline surface which is exposed within the aperture of an overlying mask. In the present case, the layer 42 overgrows the oxide layer 16 to cover and to at least slightly overlap the active areas of the lower MOSFET's first and second regions 26 and 28. The layer 42 should be grown to a thickness of about 500 nm. Excellent crystal quality can be obtained with this process, however, there is a high density of defects at the boundary between any two overgrown layers of single crystal silicon. Therefore, care should be taken when determining the positions of adjacent openings 40 so that two portions of the overgrown layer 42 do not meet in the vicinity of the gate 20. The layer 42 is then etched in the usual manner to define its periphery 43 as shown in FIG. 3.

Figure 3:
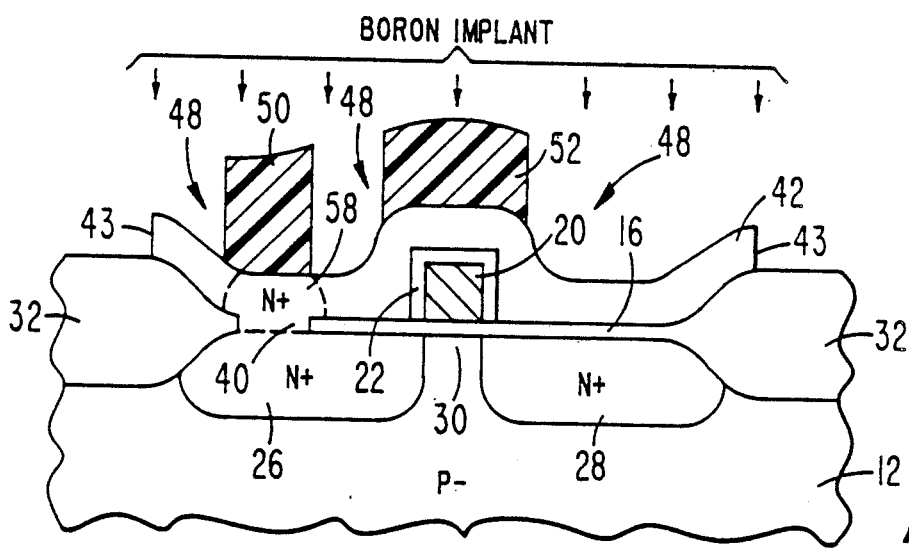
Figure 4:
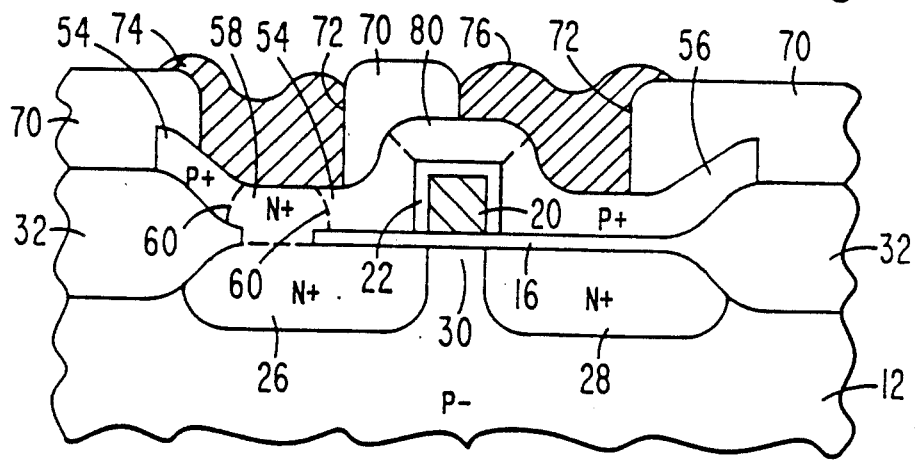

A layer of photoresist is formed on the epitaxial layer 42 and suitable openings 48 defined so that layers 50 and 52 of pholoresist remain directly over the opening 40 and over the gate 20 respectively, as shown in FIG. 3. The device 10 is then subjected to low energy boron implantation, as shown in FIG. 3, to form the third and fourth regions 54 and 56. The implantation energy level should be selected to preclude the penetration by boron ions into the gate 20 and the first and second regions 26 and 28. Note that a fifth region 58 having the same conductivity type and doping level as that of the first region 26 remains in the epitaxial layer 42 directly above the opening 40, as viewed in FIGS. 2, 3, and 4. This fifth region 58 was formed at the time the epitaxial layer 42 was grown and automatically acquired the same conductivity type and doping level as the seed, which was the region 26. By shielding this fifth region 58 with the layer 50 of photoresist during implantation of the third region 54, a resulting PN junction 60 will be formed substantially vertical with respect to the surface 14. This enables the subsequent electrical shorting of the PN junction by forming a metal conductor, as described below, in ohmic contact with both the third and fifth regions 54 and 58. Further, this results in a superior electrical contact to the first and third regions 26 and 54 which are the drains of the lower and upper MOSFETs respectively. The openings 48 are formed so that the layer 52 of photoresist defines a second channel 80 as shown in FIG. 4. Further, the second channel 80 should be somewhat centered over the gate 20 so that the first and second channels 30 and 80 and the gate are in substantial alignment as shown in FIG. 4.

A layer 70 of silicon oxide or BPSG is formed over the epitaxial layer 42 and the surrounding isolation oxide 32, and contact openings 72 are formed in a manner that is well known in the art. Metal contacts 74 and 76 are formed in ohmic contact with the third and fourth regions respectively in the usual manner, see FIG. 4. Note that in the present example, the metal contact 74 is arranged to short out the PN junction 60. Should this junction be desired, the contact 74 may optionally be positioned to preserve it or, if preferred, the photoresist layer 50 may be omitted resulting in the PN junction being formed substantially parallel to the surface 14.

Electrical connection may be made to the gate 20 and the first and second regions 26 and 28 by extending these regions and the gate laterally so that contact openings can be made thereto outside the periphery 43 of the layer 42. Techniques for making such electrical connections are well known in the art and, therefore, will not be described here.

Figure 5:
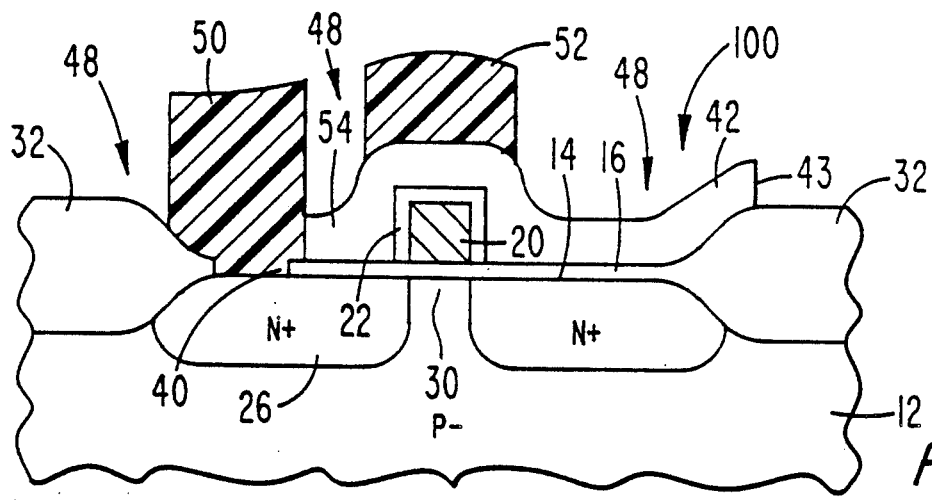
FIGS. 5 and 6 are similar to FIGS. 3 and 4 showing a second embodiment of the present invention.
Figure 6:
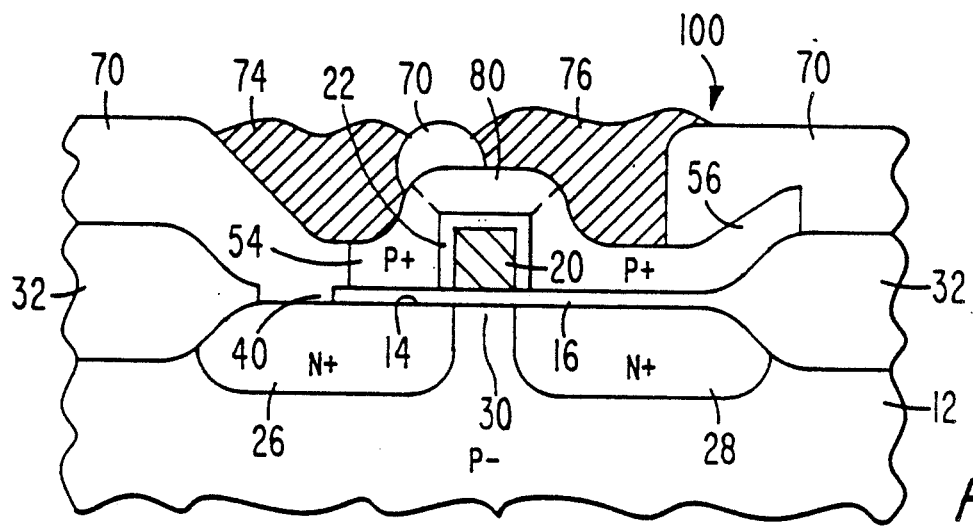

A second embodiment 100 of the device 10 is shown in FIGS. 5 and 6. Details of structure having similar identifying numbers as those of the device 10 are similar and therefore will not be described again here. In this embodiment the first and third regions 26 and 54 are not connected by the fifth region 58. The process for making the device 100 is similar to that for making the device 10 except in the following respect. When defining the periphery 43 of the layer 42, as shown in FIG. 5, the portion of the layer 42 directly over the opening 40 is also removed down to the surface 14. As with the device 10, a layer of photoresist is then formed on the epitaxial layer 42 and suitable openings 48 defined so that layers 50 and 52 of photoresist remain directly over the opening 40 and gate 20 respectively. The layer 50 in this case, however, is slightly larger than the opening 40 overlapping it on all sides. The third and fourth regions 54 and 56 are then formed by implantation as described above for the device 100. After removal of the layers 50 and 52, a layer 70 of silicon oxide or BPSG is formed over the epitaxial layer 42 and the surrounding isolation oxide 32. Note that the layer 70 fills the opening 40 thereby insulating the third region 54 from the first region 26. The metal contacts 74 and 76 are formed as described above.

Figure 7:
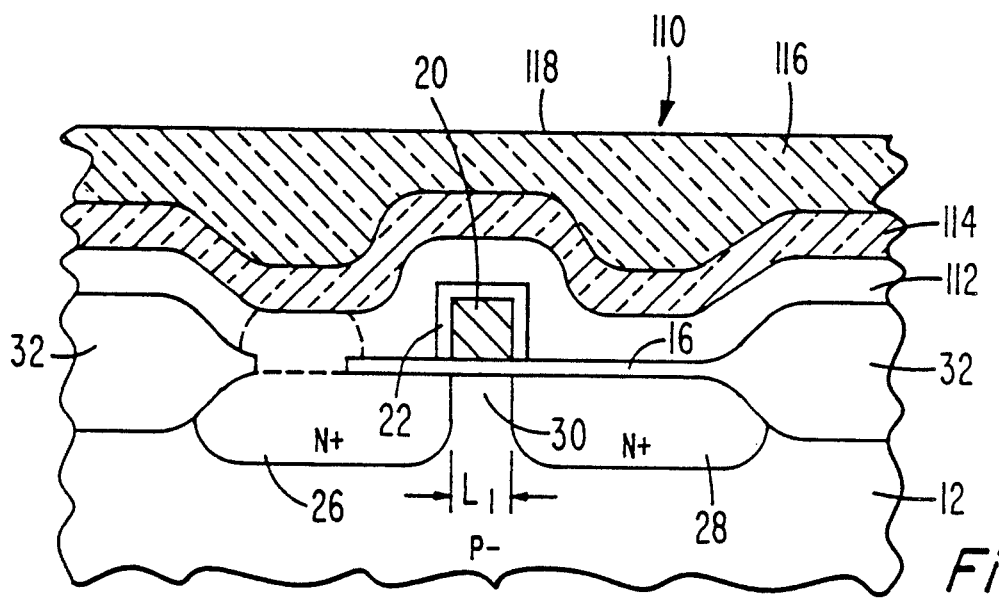
FIGS. 7 through 10 are similar to FIGS. 1 through 4 showing a third embodiment of the present invention.
Figure 8:
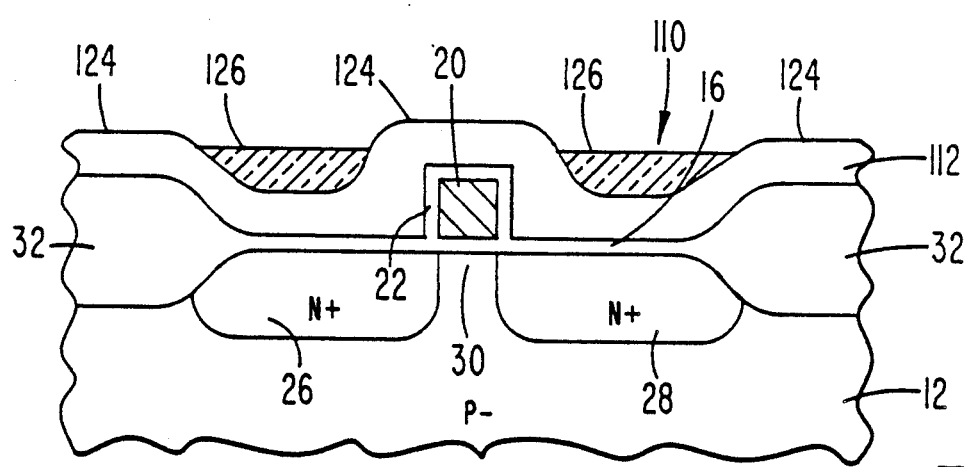
Figure 9:
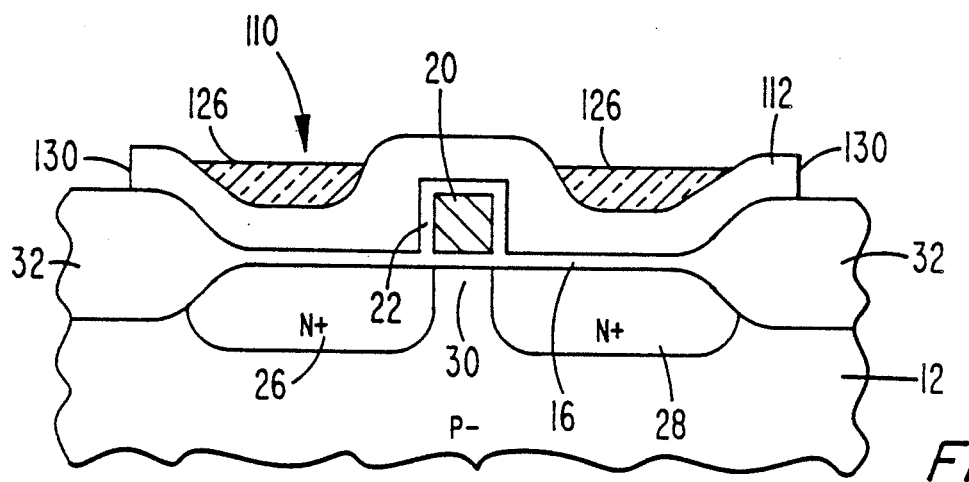

A third embodiment 110 of the device 10 is shown in FIGS. 7, 8, 9, and 10. Details of structure having similar identifying numbers as those of the device 10 are similar and therefore will not be described again here. A layer 112 of polysilicon is formed over the device 110 as shown in FIG. 7 followed by a layer 114 of highly doped glass which may be of either conductivity type, but is of P+type in the present example. A planarizing layer 116 of any suitable material such as spin-on-glass is formed on the layer 114 of doped glass. The planarizing layer 116 should have its major surface 118 substantially planar. Additionally, the material chosen for the planarizing layer 116 should have a similar etch rate as that of the layer 114 of doped glass. The etch rate of the layer 112 of polysilicon should be as small as possible. The device 110 is then subjected to an anisotropic plasma etch until the mesa surfaces 124 of the layer 112 are exposed as shown in FIG. 8. The layer 114 of doped glass is etched leaving layers 126 of doped glass in the lower areas surrounding the mesa surfaces 124. The layer 112 is then etched in the usual manner to remove unwanted material and thereby define its periphery 130 as shown in FIG. 9. Similar to the structure of the device 10, the layer 112 should extend over the oxide layer 16 to cover the gate 20 and to at least slightly overlap the active areas of the lower MOSFET's first and second regions 26 and 28.

Figure 10:
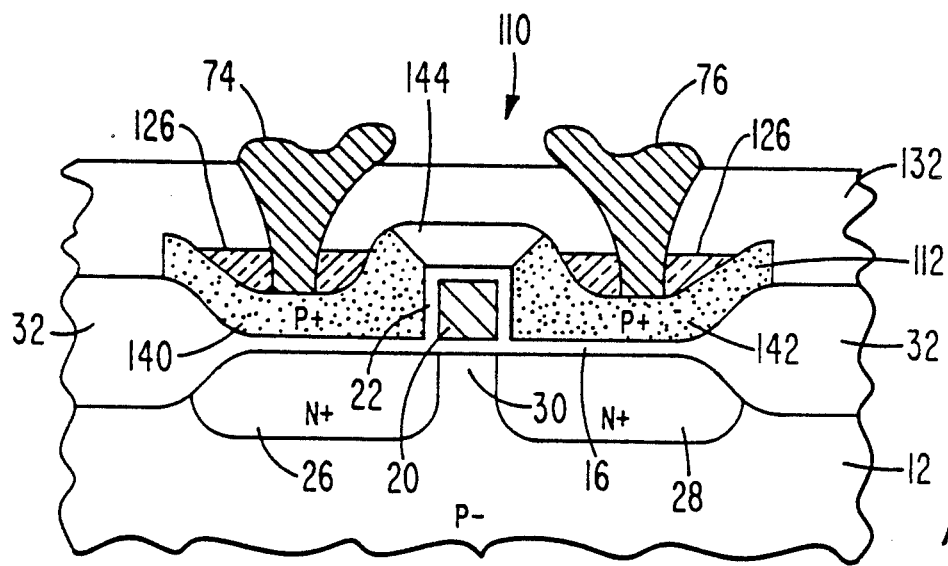

A layer 132 of BPSG or similar reflow glass is formed over the device 110 in a manner that is well known in the art. The device is then heated to about 850° C. for 30 minutes to flow the layer 132 in the usual manner. This causes impurities to diffuse from the doped glass layers 126 into the layer 112 thereby forming the third and fourth regions 140 and 142 of the same conductivity type as that of the lightly doped layer 114. As shown in FIG. 10, the third and fourth regions 140 and 142 are automatically self-aligned to the gate 20 and spaced to form the second channel 144. With this procedure, the second channel 144 is somewhat centered over the gate 20 and the first and second channels 30 and 144 and the gate are in substantial alignment as shown in FIG. 10. Contact openings are formed in the layer 132 and the metal contacts 74 and 76 are formed as described above for the device 10.

While the upper MOSFET formed in the polysilicon layer 112 is not of the high quality of single crystal silicon, it is useful in many applications such as the memory cell of a static random access memory device or a CMOS circuit not requiring high gain in the P channel MOSFET. If desired, however, the performance of the device 110 may be enhanced by recrystallization of the polysilicon layer 112. This may be done by any known short time process such as laser recrystallization or pulse heat treatment provided that the temperature and duration of the process do not cause excessive diffusion of the highly doped first and second regions 26 and 28 into the semiconducting body 12.

Any suitable process that is well known in the art may be utilized to complete the integrated circuit device. This would include metallization to interconnect various portions of the integrated circuits and passivation procedures The important advantages of the present invention are that a three dimensional structure is provided whereby a pair of MOSFETs, one stacked upon the other, occupy the same space on an integrated circuit chip as a single prior art MOSFET. The structure includes a gate and pair of channels for the two MOSFETs which are aligned and of substantially the same lengths thereby resulting in substantially reduced parasitic capacitance due to source/drain and gate overlap.

What is claimed is:

1. In an integrated circuit device including a body of semiconducting material of a first conductivity type having a planar surface, a pair of MOS field effect transistors (MOSFETs) having a common gate comprising:
   (a) highly doped first and second regions of second conductivity type disposed in said body and extending inwardly from said planar surface and being spaced to define a first channel having a length therebetween;
   (b) a layer of silicon oxide disposed on said planar surface over said first and second regions and said channel, said layer having an opening over said first region;
   (c) a layer of silicon having the same conductivity type as said first region disposed on said layer of silicon oxide over said first and second regions and said channel;
   (d) highly doped third and fourth regions of first conductivity type disposed in said layer of silicon and extending to said layer of silicon oxide and being spaced to define a second channel therebetween, said second channel being substantially opposite said first channel, said third region including a highly doped fifth region of the same conductivity type as that of said first region, being in electrical communication therewith through said opening and in PN junction forming relation with said third region;
   (e) a gate disposed between said body and said layer of silicon in substantial alignment with said first and second channels, and being insulated from said body and from said silicon layer, and having a length substantially the same as that of said first channel; and
   (f) a conducting layer contacting both of said first and third regions,
   wherein said first and third regions are in mutual ohmic contact.

2. The device set forth in claim 1 wherein said layer of silicon is a monocrystalline layer.

3. The device set forth in claim 1 wherein said layer of silicon is polysilicon.

4. In an integrated circuit device including a body of semiconducting material of a first conductivity type having a planar surface, a pair of MOS field effect transistors (MOSFETs) having a common gate comprising:
   (a) highly doped first and second regions of second conductivity type disposed in said body and extending inwardly from said planar surface and being spaced to define a first channel having a length therebetween;
   (b) an insulated gate disposed on said planar surface in substantial alignment with said first channel and being insulated from said body;
   (c) a layer of silicon oxide disposed on said planar surface over said first and second regions and over said insulated gate, said layer having an opening over said first region;
   (d) a layer of silicon of second conductivity type disposed on said layer of silicon oxide over said first and second regions and over said insulated gate;
   (e) highly doped third and fourth regions of first conductivity type disposed in said layer of silicon and extending to said layer of silicon oxide and being spaced to form a second channel substantially opposite said first channel; and
   a conducting layer contacting both of said first and third regions;
   wherein said first and third regions are in mutual ohmic contact.

5. The device set forth in claim 4 wherein said layer of silicon is a monocrystalline layer.

6. The device set forth in claim 4 wherein said layer of silicon is polysilicon.

* * * * *